United States Patent [19]

Kosaki

[11] Patent Number: 5,272,111
[45] Date of Patent: Dec. 21, 1993

[54] METHOD FOR MANUFACTURING SEMICONDUCTOR DEVICE CONTACT

[75] Inventor: Katsuya Kosaki, Itami, Japan

[73] Assignee: Mitsubishi Denki Kabushiki Kaisha, Tokyo, Japan

[21] Appl. No.: 780,065

[22] Filed: Oct. 21, 1991

[30] Foreign Application Priority Data

Feb. 5, 1991 [JP] Japan .................................. 3-38086

[51] Int. Cl.⁵ .................... H01L 21/441; H01L 21/02
[52] U.S. Cl. .................................. 437/192; 437/189; 437/230; 427/98; 204/192.25
[58] Field of Search .............. 437/230, 184, 189, 192; 148/DIG. 1; 427/98; 204/192.25

[56] References Cited

FOREIGN PATENT DOCUMENTS

| | | |
|---|---|---|
| 3124879 | 3/1982 | European Pat. Off. . |
| 0382298 | 2/1990 | European Pat. Off. . |
| 4871975 | 9/1973 | Japan . |
| 61-163664 | 7/1986 | Japan . |
| 62-210649 | 9/1987 | Japan . |
| 62-274673 | 11/1987 | Japan . |
| 63-318145 | 12/1988 | Japan . |
| 2212516 | 7/1989 | United Kingdom . |

OTHER PUBLICATIONS

"Electroless Deposition as a Means of Obtaining Ohmic Contacts: Au/Pd Onto GaAs", D. Lamouche et al., Solid State Electronics, vol. 29, No. 6, pp. 625–632, 1986.
"Electroless Gold Plating on III–V Compound Crystals", L. A. D'Asaro et al., Journal of The Electrochemical Society, vol. 127, No. 9, pp. 1935–1940, Sep. 1980.
"Activation and Electroless Plating of Silicon Surfaces," A. F. Schemeckenbecher, IBM Technical Disclosure Bulletin, vol. 10, No. 12, p. 1972, May 1968.
"Plating for Semiconductor Devices", D. R. Turner, Fall Meeting of Electrochemical Society, vol. 72-2, pp. 499–500, Oct. 8–13, 1972.
"Amorphous Metal-Semiconductor Contacts for High Temperature Electronics—I", A. G. Todd et al., Solid State Electronics, vol. 27, No. 6, pp. 507–513, Jun. 1984.

Primary Examiner—John S. Maples
Attorney, Agent, or Firm—Leydig, Voit & Mayer

[57] ABSTRACT

An amorphous Ni-P layer which nullifies the effects of the crystallinity of a base metal layer is formed on the base metal layer in a metallic element of a field effect transistor by electroless plating. An electrolytic Au layer is deposited on the amorphous Ni-P layer. Thus, there are no luster nonuniformities in the electrolytic Au layer, whereby the position of an electrode pad or like metallic element is easily detected mechanically and automated bonding and packaging of the field effect transistor are simplified.

16 Claims, 9 Drawing Sheets

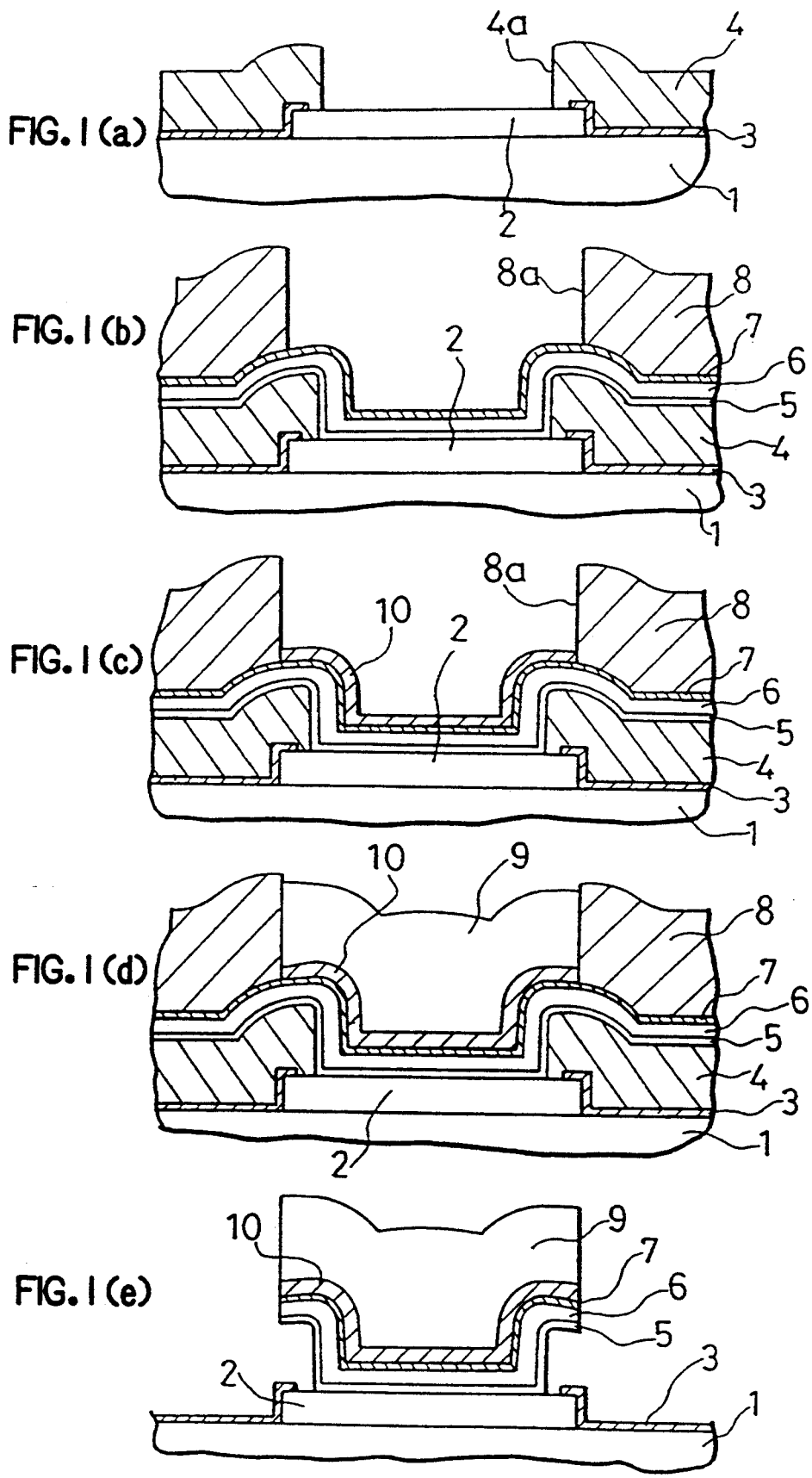

METHOD FOR MANUFACTURING SEMICONDUCTOR DEVICE CONTACT

FIELD OF THE INVENTION

The present invention relates to a method for manufacturing a semiconductor device and, more particularly, to a method for forming an electrolytic Au pattern on a high frequency GaAs IC and a high output IC.

BACKGROUND OF THE INVENTION

FIG. 8 is a perspective view showing a structure of a conventional microwave monolithic IC (MMIC). In FIG. 8, reference numeral 100 designates an MMIC chip and reference numeral 1 designates a gallium arsenide substrate on which first and second active elements 101 and 102 formed of field effect transistors (FET), a capacitor element 103, an inductor element 104, a resistor element 105 or the like are disposed. In addition, reference numerals 131 to 135 designate bonding pads arranged at the periphery of the semiconductor substrate 1 and reference numerals 111 to 113 designate signal transmission lines which connect the elements to each other or to a predetermined bonding pad. In addition, reference numerals 121 and 122 designate first and second air bridge wirings which connect the bonding pads over the first and second active elements 101 and 102, respectively, and reference numeral 106 designates a via hole which connects the predetermined bonding pad to an electrode 130 on a back surface.

In order to obtain a good operational characteristic at a high frequency such as a microwave band, a low resistance metal layer is formed on the conductor layers such as the electrodes of FET, the boding pads and the inductor element. An applicant of the present invention has already disclosed a method for forming a low resistance upper part gate electrode on a base gate electrode in Japanese Patent Publication 62-274673 as an example of a technique capable of being applied to such a microwave band device.

FIG. 9(d) is a sectional view taken along a line IXd—IXd in FIG. 8, which shows in detail the bonding pad 133 connected to the FET element. In FIG. 9(d), reference numeral 2 designates an FET electrode on the semiconductor substrate 1, reference numeral 3 designates a passivation film for protecting the surface of the substrate, reference numeral 9 designates an electrolytic Au layer on the FET electrode 2 with an intervening metal adhesion layer 5 and a feeder Au layer 6. As the metal adhesion layer 5, a Ti layer or a Cr layer is used and the feeder Au layer 6 serves as a cathode electrode for applying a current at the time of electrolytic plating. In addition, reference numeral 9a designates a rough morphology portion of the electrolytic Au layer 9.

Next, the manufacturing method will be described. Each element of the MMIC is formed on the semiconductor substrate and then the base metal layer and its upper electrolytic Au layer of the bonding pads and the signal transmission lines are sequentially formed.

The method for forming the electrolytic Au layer on the bonding pad is described in detail hereinafter. After the FET electrode is formed, the passivation film 3 is deposited on the whole surface of the semiconductor substrate 1 and then selectively removed by reactive ion etching or plasma etching to expose the surface of the FET electrode 2. Then, a first resist layer 4 is applied thereto and patterned to form an opening 4a at the FET electrode 2. Then, the Ti adhesion layer 5 and the feeder Au layer 6 are sequentially formed by sputtering (FIG. 9(a)).

Then, a second resist layer 8 is applied thereto and patterned to form an opening 8a where the FET electrode 2 is arranged (FIG. 9(b)). Then, the substrate is immersed in a plating solution and a current is applied with the feeder Au layer 6 as a cathode to form the electrolytic Au layer 9 in the opening 8a of the second resist layer 8 (FIG. 9(c)). Then, the second resist layer 8, the feeder Au layer 6, the adhesion layer 5 and the first resist layer 4 are sequentially removed and then the bonding pad having a sectioned structure shown in FIG. 9(d) is obtained.

However, according to the above method, the surface of the electrolytic Au layer which is in contact with the base metal layer is rough and the nonuniformity causes its appearance to be damaged or prevents the pad from being detected at the time of automated bonding. In FIG. 8, dotted marks show that the surface is rough.

More specifically, in thermal processing, for example for forming the passivation film 3, as the base metal layer 2 such as the FET electrode formed by vapor deposition is crystallized, the size of the crystal grains increases as shown in FIG. 10(a) and (b). In other words, the surface of the base metal layer 2 becomes rough. Therefore, even when the Ti adhesion layer or the feeder Au layer 6 is formed between the electrolytic Au layer 9 and the base metal layer 2, the electrolytic Au layer 9 is rough because of the surface of the base metal layer 2 in which the crystal grain size is increased (FIG. 10(c)). The grain size changes unevenly because of crystal growth with a preferred orientation of the plating relative to the <111> surface of the electrolytic Au layer 9 or the surface condition of the base metal layer 2. Thus, the electrolytic Au 9 shows morphology 9a in which large crystalline grains roughly exist.

As a result, the luster is changed between or in the pattern, for example between different signal transmission lines or in one signal transmission line, the luster nonuniformity damages not only plated appearance but also automation using auto-bonding in packaging process.

In the above electrode forming method, when the Ti adhesion layer 5 and the feeder Au layer 6 are removed by wet etching, the electrolytic Au layer 9 is etched away at the same time, causing the surface of the layer 9 to become irregular. However, as a method for solving this problem, the applicant of the present invention has already disclosed a method for etching the lower Ti adhesion layer and the feeder Au layer while the surface of the electrolytic Au layer 9 is covered with the Ti layer in Japanese Patent Publication No. 63-318145.

SUMMARY OF THE INVENTION

The present invention was made to solve the above problems and it is an object of the present invention to provide a method for manufacturing a semiconductor device in which luster nonuniformity of an electrolytically plated layer is significantly improved, whereby the position of an electrode pad can be mechanically detected easily, automation using auto-bonding in packaging process is not affected, and the appearance is improved As a result, the value of a device such as an MMIC can be enhanced.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a method for manufacturing a semiconductor device of the present invention, plating process for forming a metal gilding layer on a base metal layer comprises pre-plating step of forming a conductive buffer layer which cancels the crystallinity of the lower layer on the base metal layer and a plating step of selectively forming the metal layer on the conductive buffer layer by electrolytic plating. As the conductive buffer layer, the following layer is used, that is, a layer whose surface grain size is controlled uniform, and no larger than a predetermined size in a surface region having its predetermined plane pattern over the whole surface region. Thus, a fine crystal can be uniformly grown without increasing the size of the grains nor generating nonuniform grains when the metal gilding layer is grown, whereby luster uniformity of the plated metal layer is significantly improved. As a result, the position of the electrode pad can be mechanically detected easily, automation using the auto-bonding in the packaging process is not affected and the appearance is improved, whereby the value of the device such as an MMIC is enhanced.

According to a first aspect of the present invention, the above pre-plating step comprises a first step of forming an opening on the base metal layer by applying a first resist film on the semiconductor substrate and patterning it, a second step of sequentially depositing by sputtering a metal adhesion layer which strongly adheres to the base metal layer, a feeder metal layer for plating which serves as a cathode electrode for conducting a current at the time of electrolytic gilding and a Pd activated layer serving as a catalyst at the time of electroless plating, a third step of forming an opening on the base metal layer by applying a second resist film on the Pd activated layer and then patterning it and a fourth step of forming an amorphous gilding film as the conductive buffer layer at the opening of the second resist film by electroless plating, wherein the plating step comprises forming an Au plating layer at the opening of the second resist film by electrolytic plating. Since the amorphous layer is formed as the conductive buffer layer by electroless plating, the conductive buffer layer can be easily formed by immersing it in a plating solution.

According to a second aspect of the present invention, instead of the above-described second, third and fourth steps, the following steps are used, that is, a sixth step of sequentially depositing by sputtering on the whole surface a metal adhesion layer which strongly adheres to the base metal layer, an amorphous alloy layer serving as the conductive buffer layer and a feeder metal layer for plating which serves as a cathode electrode for applying a current at the time of electrolytic plating and a seventh step of forming an opening on the base metal layer by applying a second resist film on the feeder metal layer for plating and then patterning it. Since the amorphous alloy layer is formed by sputtering, a catalytic layer for electroless plating is not necessary. In addition, since the metal adhesion layer and the feeder metal layer for plating are also formed by sputtering, these metal layers can be sequentially formed with good operability.

According to a third aspect of the present invention, instead of the above-described second, third and fourth steps, the following steps are used, that is, an eighth step of sequentially depositing by sputtering on the whole surface a metal adhesion layer which strongly adheres to the base metal layer and a feeder metal layer for plating which serves as a cathode electrode for conducting a current at the time of electrolytic plating, a ninth step of forming an opening on the base metal layer by applying a second resist film on the feeder metal layer for plating and then patterning it and a tenth step of further forming an amorphous plating layer serving as the conductive buffer layer at the opening of the second resist film by electrolytic plating. Since the amorphous layer is formed by electrolytic plating, the Pd activated layer as a catalyst for electrolytic plating is not necessary and the process can be smoothly moved to the step of forming the electrolytic Au plating layer.

According to a fourth aspect of the present invention, instead of the above-described ninth and tenth steps, the following steps are used, that is, an eleventh step of forming a palladium film whose grain size on a is controlled to be uniformly 0.3 micron or less on the feeder metal layer for plating by immersing it to a $PdCl_2$ solution, sputtering or vapor deposition and a twelfth step of forming the opening on the base metal layer by applying the second resist film on the palladium layer and then patterning it. Therefore, the conductive buffer layer can be easily formed in only one process of immersing it in a $PdCl_2$ solution, sputtering, or vapor deposition.

According to a fifth aspect of the present invention, instead of the above-described tenth step, the following step is used, that is, a thirteenth step of forming a palladium film whose grain size is controlled to be uniformly 0.3 micron or less at the opening of the second resist film by immersing it in a $PdCl_2$ solution. Therefore, the conductive buffer layer can be easily formed by only one process of immersing it in a $PdCl_2$ solution, sputtering, or vapor deposition.

According to a sixth aspect of the present invention, instead of the above-described ninth and tenth steps, the following steps are used, that is, a fourteenth step of applying an additional resist film and then patterning it so that a rectangular part having one side of approximately 1 micron length and arranged like a grid may be left, a fifteenth step of performing ion implantation using the additional resist film as a mask and then removing the additional resist film and a sixteenth step of forming an opening on the base metal layer by applying a second resist film on the feeder metal layer for plating and then patterning it. Therefore, the conductive buffer layer can also serve as the feeder metal layer for plating, whereby the process for forming the film can be simplified.

BRIEF DESCRIPTION OF THE DRAWINGS

FIGS. 1(a) to 1(e) are sectional views showing a process of forming a plating electrode in a method for manufacturing a semiconductor device in accordance with a first embodiment of the present invention;

DETAILED DESCRIPTION OF PREFERRED EMBODIMENTS

Figure 9A:
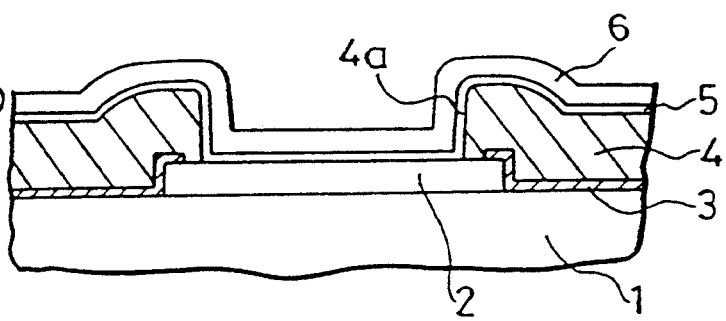
FIGS. 9(a) to 9(d) are sectional views showing process steps of forming an electrolytic Au layer in a conventional method for manufacturing the MMIC.
Figure 9B:
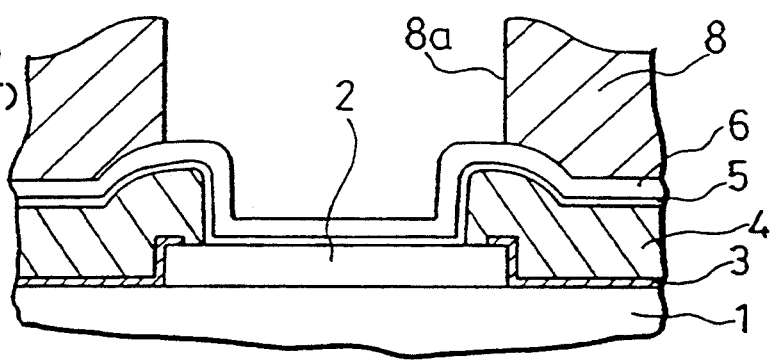
Figure 9C:
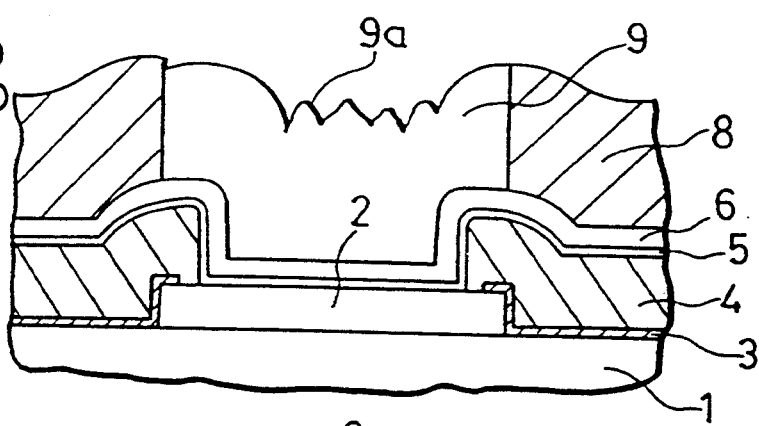
Figure 9D:
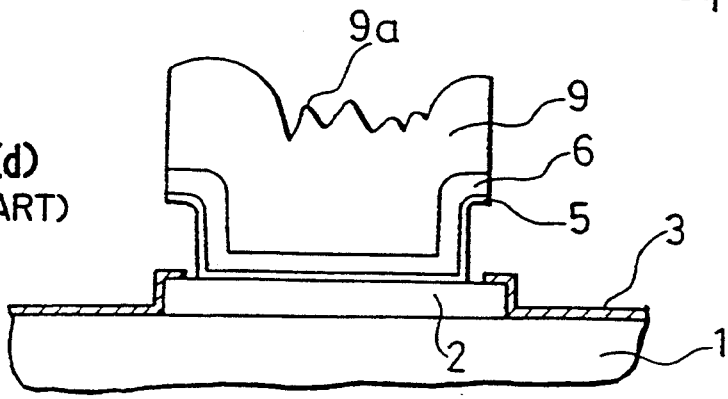
Figure 10A:
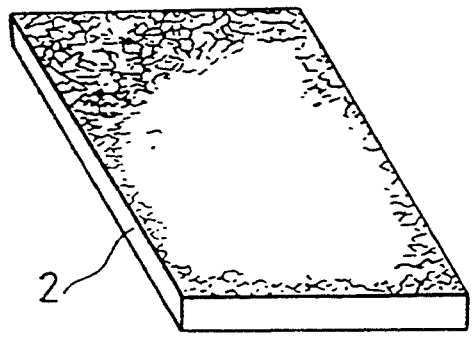
FIGS. 10(a) to 10(c) are schematic views showing the mechanism in which a plated surface becomes rough in the conventional process steps of forming the electrolytic Au layer.
Figure 10B:
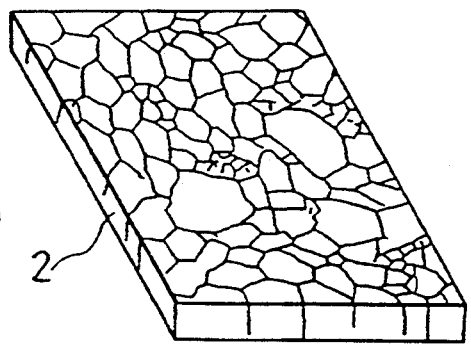
Figure 10C:
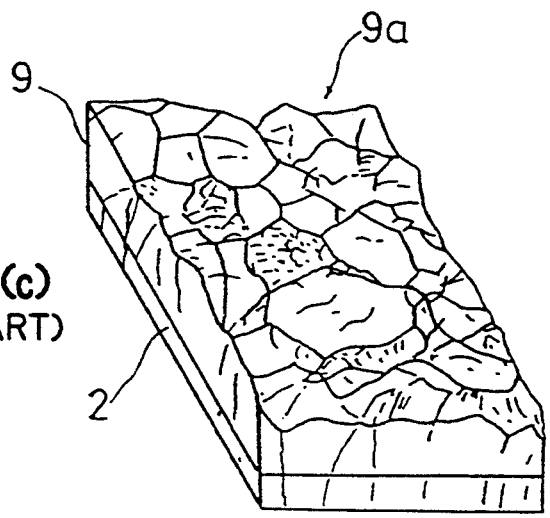

FIGS. 1(a) to 1(e) are sectional views of process steps of a method for manufacturing a semiconductor device in accordance with a first embodiment of the present invention. In FIG. 1(e), the same reference numbers as in FIG. 9(d) designate the same or corresponding parts. Reference numeral 10 designates an amorphous Ni-P layer between the electrolytic Au layer 9 and the feeder Au layer 6 formed by electroless plating. The grain size of the amorphous Ni-P layer 10 on the surface is uniformly 0.3 micron or less, which can be disregarded as compared with the grain size of the base metal layer 2 (FET electrode). In addition, in the amorphous Ni-P layer 10, epitaxial growth does not occur. Reference numeral 7 designates a Pd activated layer between the amorphous Ni-P layer 10 and the feeder Au layer 6, which serves as a plating catalyst when the amorphous Ni-P layer 10 is electrolessly plated.

Next, the manufacturing method will be described. Steps until the FET electrode 2 is formed on the semiconductor substrate are the same as in the conventional example. Thereafter, the passivation film 3 such as a silicon oxide film or a nitride film is deposited by chemical vapor deposition (CVD) and then is etched away to expose the base metal film 2. Then, the first resist layer 4 is applied thereto and patterned to form the opening 4a exposing the FET electrode 2 (FIG. 1(a)).

In this state, the Ti adhesion layer 5, the feeder Au layer 6 and the Pd activated layer 7 are sequentially deposited by sputtering and then the second resist layer 8 is applied and patterned to form the opening 8a opposite the FET electrode 2 (FIG. 1(b))

Then, electroless Ni plating is performed using the second resist layer 8 as a mask and the Pd activated layer 7 as a catalyst to form the amorphous Ni-P layer 10 on the exposed surface of the Pd activated layer 7 in the opening 8a (FIG. 1(c)). At this time, since sodium hypophosphine or borohydride is mixed in an Ni plating bath as a reducing agent, the reducing agent is decomposed in a side reaction. As a result, the plating film is an amorphous film of Ni-P or Ni-B. In this case, the amorphous Ni-P film 10 is used.

Then, the substrate is immersed in Au Plating solution and a current is applied to the feeder Au layer 6 serving as a cathode to form the electrolytic Au layer 9 on the electroless layer 10 (FIG. 1(d)). Then, the second resist layer 8, the feeder Au layer 6, the adhesion layer 5 and the first resist layer 4 are sequentially removed and then the bonding pad having a section structure shown in FIG. 1(e) is obtained.

In addition, the resist layers 4 and 8 are removed by a releasing agent, an organic solvent, or $O_2$ ashing. The sputtered films such as the Ti adhesion layer 5 and the feeder Au layer 6 are removed by ion milling, reactive ion etching, or both.

As described above, in this first embodiment of the present invention, since the amorphous Ni-P layer 10 is formed between the FET electrode 2 and the electrolytic Au layer 9, even when the grain size of the FET electrode 2 is increased the effects of its crystallinity is canceled by the amorphous Ni-P layer 10 having fine grains. Therefore, when the electrolytic Au layer 9 is deposited, fine crystals are uniformly grown without increasing grain size nor making it uneven, whereby luster nonuniformity on the surface of the electrolytic Au layer 9 is reduced. As a result, the position of the electrode pad can be mechanically detected in an easy manner and automation using the auto-bonding in a packaging process is not affected and the appearance is improved, whereby the value of the device such as an MMIC is enhanced.

In addition, although Ni-P is used as a material of the amorphous electroless film in the above first embodiment, another amorphous metal material capable of electroless plating such as Ni-B or Co-P may be used when the proper bath is used.

In addition, although the amorphous Ni-P layer 10 is formed by electroless plating in the above first embodiment, the method for forming the amorphous film is not so limited, and, for example, sputtering or electrolytic plating can be used.

Figure 2A:
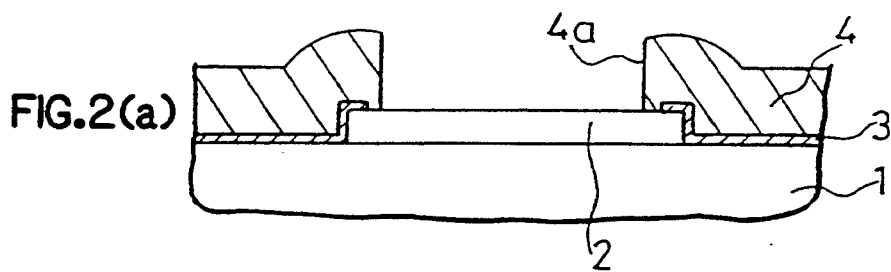
FIGS. 2(a) to 2(d) are sectional views showing a process of forming an amorphous layer by sputtering instead of electroless plating in the above process step of forming the gilding electrode in accordance with a second embodiment of the present invention.
Figure 2B:
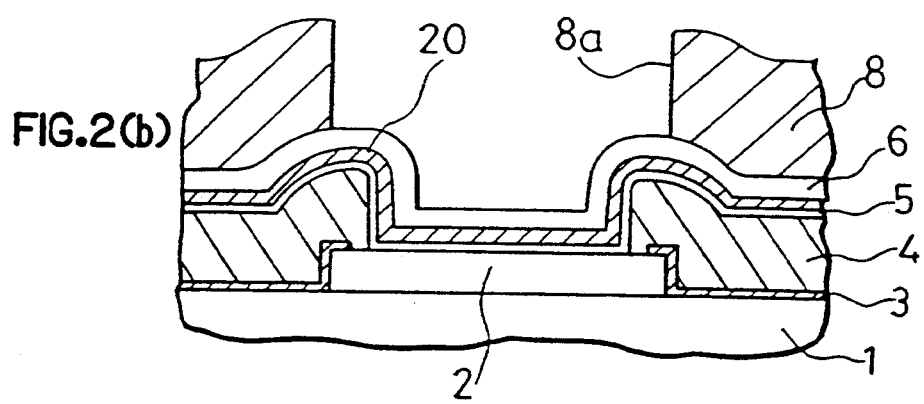
Figure 2C:
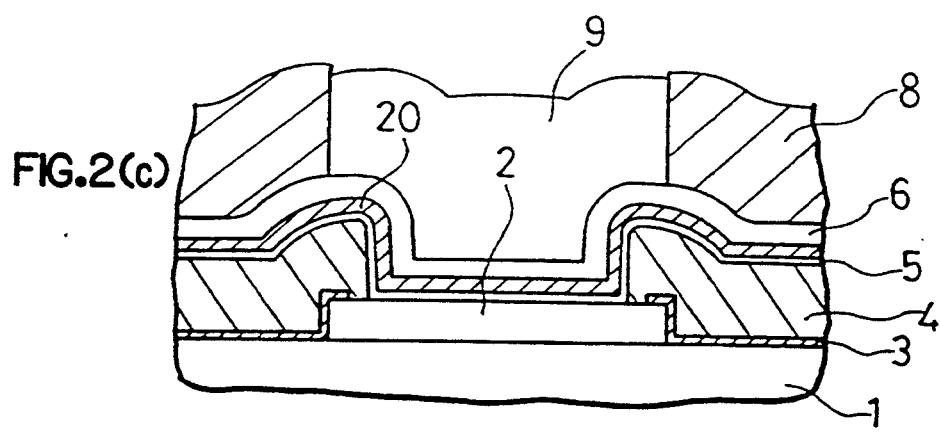
Figure 2D:
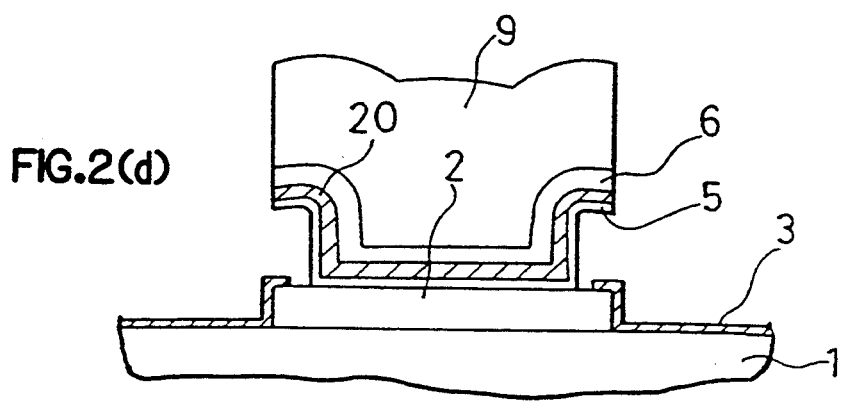

FIGS. 2(a) to 2(d) are sectional views of process steps of a method for manufacturing a semiconductor device in which an amorphous layer is formed by sputtering in accordance with a second embodiment of the present invention. In FIG. 2(d), the same reference numbers as in FIG. 1(d) designate the same elements. Reference numeral 20 designates an amorphous alloy sputtered layer formed between the Ti adhesion layer 5 and the feeder Au layer 6, whose grain size is 0.3 micron or less so that epitaxial growth does not occur in that layer, which is the same as the amorphous Ni-P layer. The Pd activated layer 7 is not used in this case.

Next, the manufacturing method will be described. First, an opening 4a is formed in the first resist layer 4 like the above-described first embodiment (FIG. 2(a)). Then, the Ti adhesion layer 5, the amorphous alloy layer 20 and the feeder Au layer 6 are sequentially deposited by sputtering and then the second resist layer 8 is applied and patterned to form the opening 8a (FIG. 2(b)). Then, the electrolytic Au layer 9 is formed by electrolytic plating using the second resist layer 8 as a mask (FIG. 2(c)). Then, the second resist layer 8, the feeder Au layer 6, the amorphous alloy layer 20, the adhesion layer 5 and the first resist layer 4 are sequentially removed and then the bonding pad shown in FIG. 2(d) is obtained.

In this second embodiment of the present invention, since the amorphous alloy layer 20 having a fine crystal boundary, that is, uniformly small crystal grains is formed by sputtering, in addition to the effects of the above embodiment, the Pd activated layer serving as a catalyst for electroless plating is not necessary, and the amorphous alloy layer 20 can be sequentially formed with the Ti adhesion layer 5 and the feeder Au layer 6, so that its operability is improved.

Figure 3A:
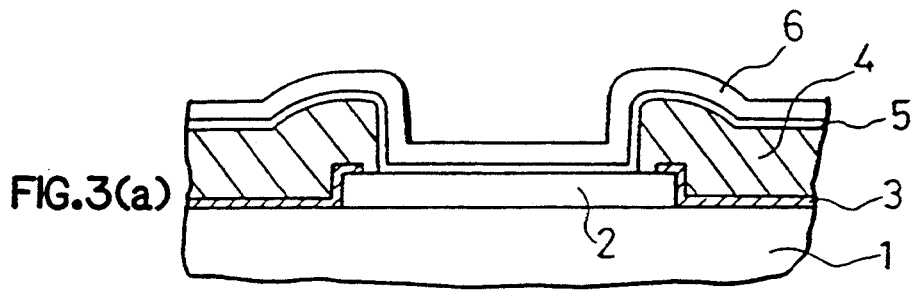
FIGS. 3(a) to 3(d) are sectional views showing a process of forming the amorphous layer by electrolytic plating instead of sputtering in accordance with a third embodiment of the present invention.
Figure 3B:
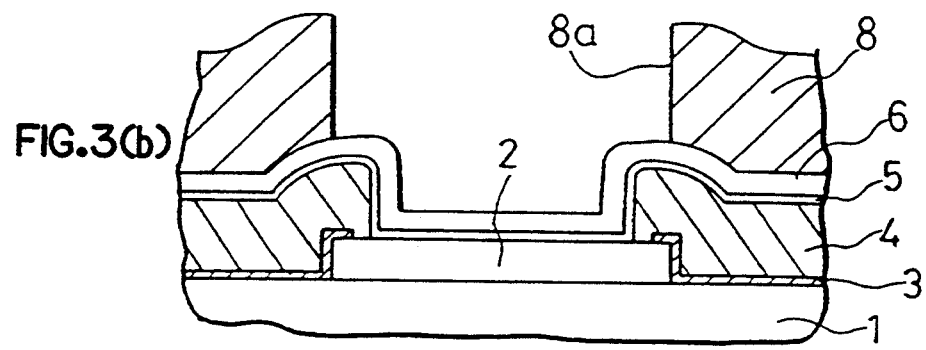
Figure 3C:
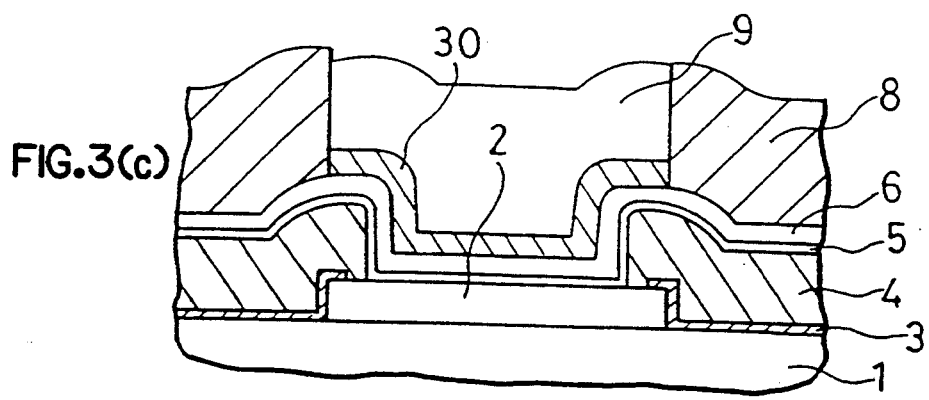
Figure 3D:
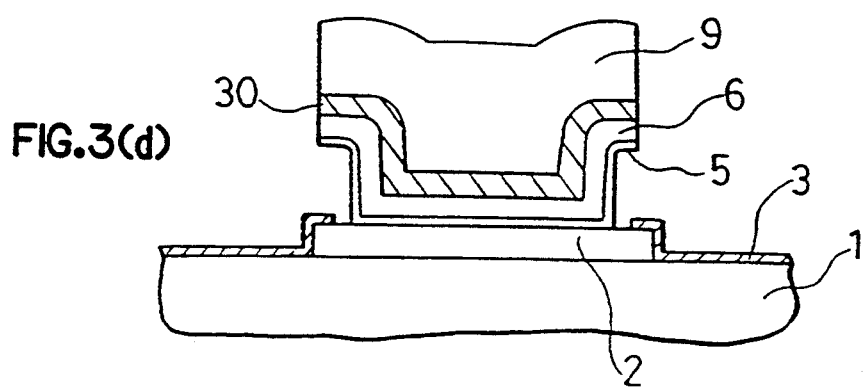

FIGS. 3(a) to 3(d) are sectional views of process steps of a method for manufacturing a semiconductor device in which an amorphous layer is formed by electrolytic plating in accordance with a third embodiment of the present invention. In FIG. 3(d), reference numeral 30 designates an amorphous electrolytic layer whose grain size is 0.3 micron or less that is deposited between the feeder Au layer 6 and the electrolytic Au layer 9, in which epitaxial growth does not occur. The Pd activated layer 7 is not used in this third embodiment. The other elements are the same as in the above-described first embodiment.

Next, the manufacturing method will be described. Since the steps until the feeder Au layer 6 is formed (FIG. 3(a)) are the same as in the first embodiment of the present invention, their description is omitted. After the step shown in FIG. 3(a), the second resist layer 8 is applied and patterned to form the opening 8a (FIG. 2(b)). Then, the substrate is immersed in a plating bath such as Ni and a current is applied to the feeder Au layer 6 to form the amorphous electrolytic layer 30. Then, the substrate 1 is immersed in an Au plating bath and the electrolytic Au layer 9 is formed (FIG. 3(c)). In this case, as the amorphous film which can be formed by electrolytic plating, Ni-P, Co-P, Fe-P, Co-Ni-P, Co-W, Fe-W, Cr-W, Fe-Mo, Cr-Fe or the like are known. Then, the second resist layer 8, the feeder Au layer 6, the adhesion layer 5 and the first resist layer 4 are sequentially removed and then the bonding pad having a sectional structure shown in FIG. 3(d) is obtained.

In this third embodiment of the present invention, since the amorphous layer 30 having a fine crystal boundary is formed by electrolytic plating in addition to the effect of the first embodiment, the Pd activated layer serving as a catalyst for electroless plating is not necessary and the process can be smoothly moved to the step of forming the electrolytic Au layer 9, so that its operability is improved.

Although the method for forming the amorphous layer between the FET electrode 2 and the electrolytic Au layer 9 as a conductive buffer layer is shown in the first to third embodiments, a Pd (palladium) film can be used as the conductive buffer layer.

Fourth and fifth embodiments of the present invention, in which the Pd layer is used as the conductive buffer layer, will be described.

Figure 4A:
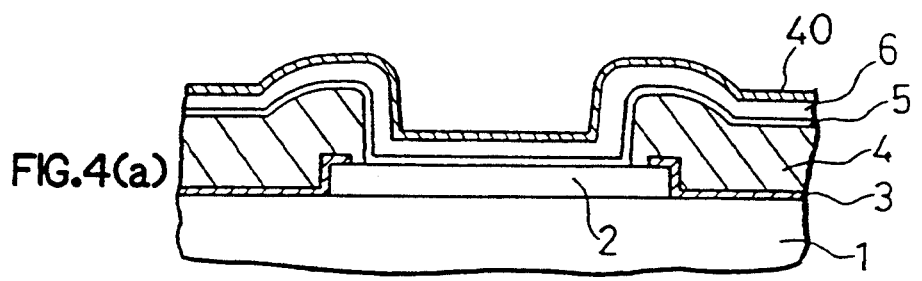
FIGS. 4(a) and 4(b) are sectional views in accordance with a fourth embodiment of the present invention, in which a Pd film having a fine grain on the surface thereof is used instead of the amorphous layer in the process steps of forming the plated electrode shown in FIGS. 1(a) to 1(e)
Figure 4B:
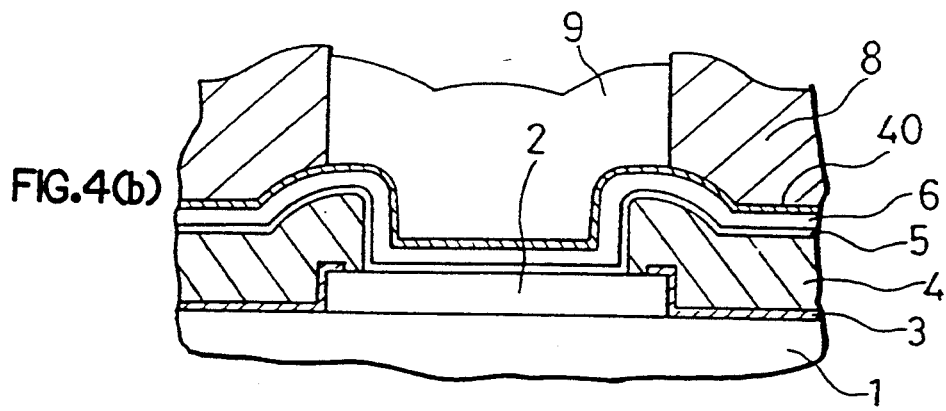

FIGS. 4(a) and 4(b) are sectional views of process steps of the method for manufacturing a semiconductor device in accordance with the fourth embodiment of the present invention. In FIG. 4(d), reference numeral 40 designates a Pd fine crystal film whose grain size is uniformly 0.3 or less, in which epitaxial growth does not occur. The electrolytic Au layer 9 is disposed directly on the Pd fine grain film 40. The other elements are the same as in the first embodiment.

More specifically the Ti adhesion layer 5 and the feeder Au layer 6 are sequentially formed on the whole surface by sputtering after the step shown in FIG. 1(a) and then the substrate is immersed in a $PdCl_2$ solution for approximately two minutes to form the Pd fine grain film 40 (FIG. 4(a)). In this case, as the $PdCl_2$ solution, Red Sumer (produced by Nihon Kanizen Co. Ltd.) which is diluted in 5 volumes of pure water is used. In addition, the Pd fine grain film 40 can be formed by sputtering or vapor deposition of Pd, instead of by immersing it in the $PdCl_2$ solution. Then, the second resist layer 8 is applied and patterned and then the electrolytic Au layer 9 is formed using this resist layer 8 as a mask as in the above embodiments of the present invention (FIG. 4(b)).

In this fourth embodiment of the present invention, since the electrolytic Au layer 9 is directly formed on the Pd fine grain film 40 having a small grain diameter, the step of forming the amorphous Ni-P layer can be omitted, whereby productivity can be improved in addition to the effect of the first embodiment. In addition, since the immersion time in the $PdCl_2$ is approximately two minutes so that a Pd crystal nucleus does not grow, the electrolytic Au layer whose surface has no luster nonuniformity and small grain diameter is formed.

Although the immersion time in the $PdCl_2$ solution is approximately two minutes in the above fourth embodiment, there is no problem even if that time exceeds 5 minutes. More specifically, as the immersion time is increased, the grain diameter is uniformly increased but luster nonuniformities do not occur.

Figure 5A:
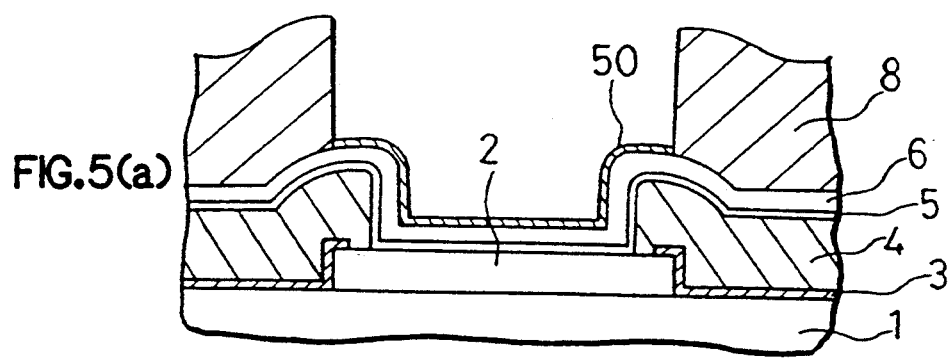
FIGS. 5(a) and 5(b) are sectional views in accordance with a fifth embodiment of the present invention, in which the order of the step of forming the Pd layer and the step of forming the plating mask is changed.
Figure 5B:
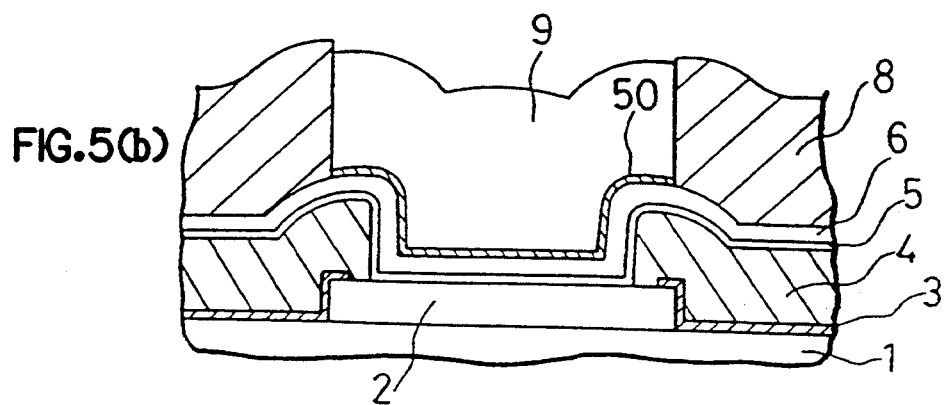
Figure 6A:
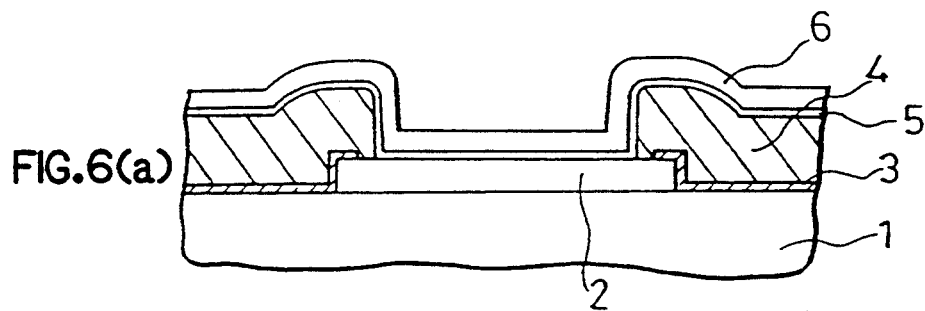
FIGS. 6(a) to 6(d) are sectional views in accordance with a sixth embodiment of the present invention, in which a feeder metal layer for plating in parts of which ions are implanted is used instead of the amorphous layer in the process steps of forming the plated electrode shown in FIGS. 1(a) to 1(e)
Figure 6B:
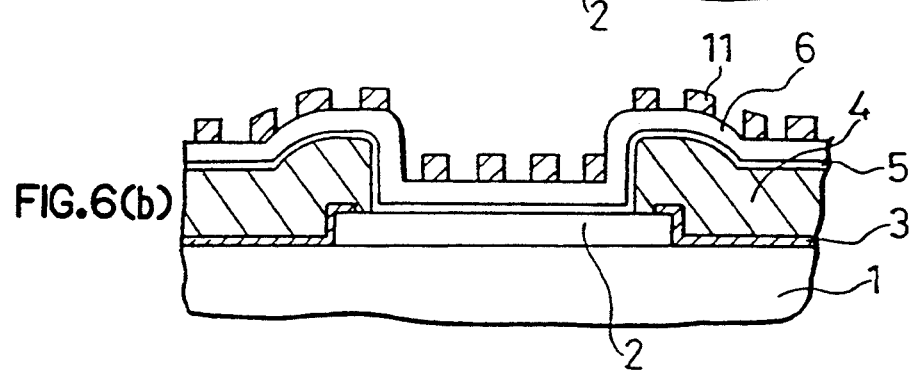
Figure 6C:
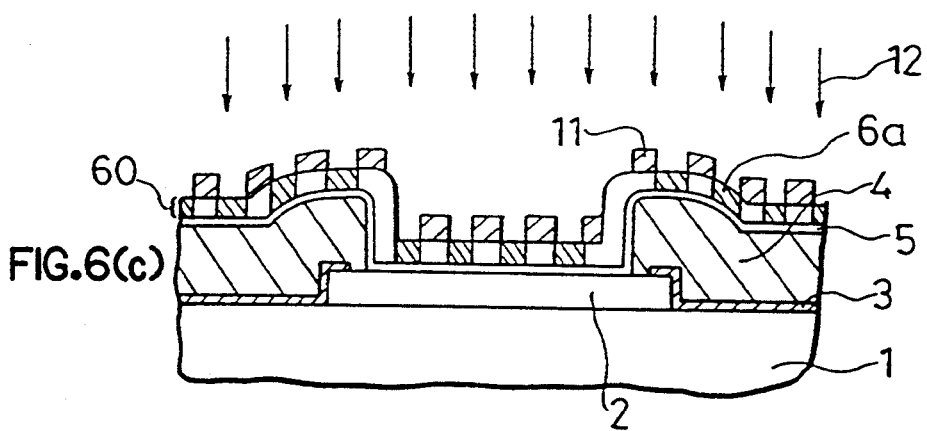
Figure 6D:
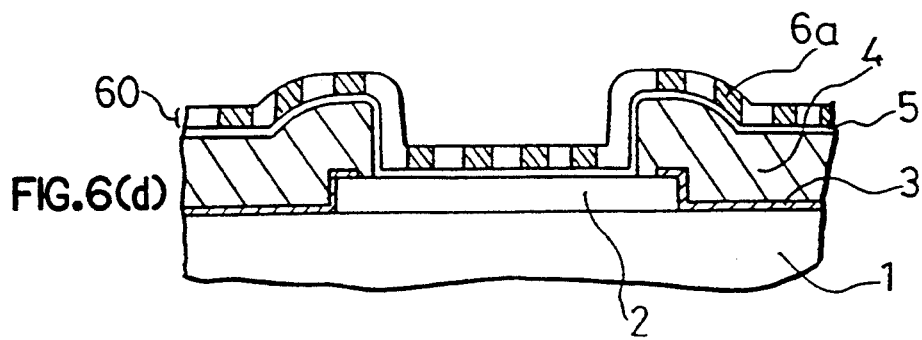

FIGS. 5(a) and 5(b) are sectional views in accordance with the fifth embodiment of the present invention. After the feeder Au layer 6 is formed, the second resist layer 8 is applied and patterned and then the substrate is immersed in the $PdCl_2$ solution (FIG. 5(a)), which is the only point that is different from the fourth embodiment of the present invention. Then, the electrolytic Au layer 9 is formed in the same manner as in the fourth embodiment (FIG. 5(b)). In this fifth embodiment, the same effect as in the fourth embodiment can be obtained.

Figure 7A:
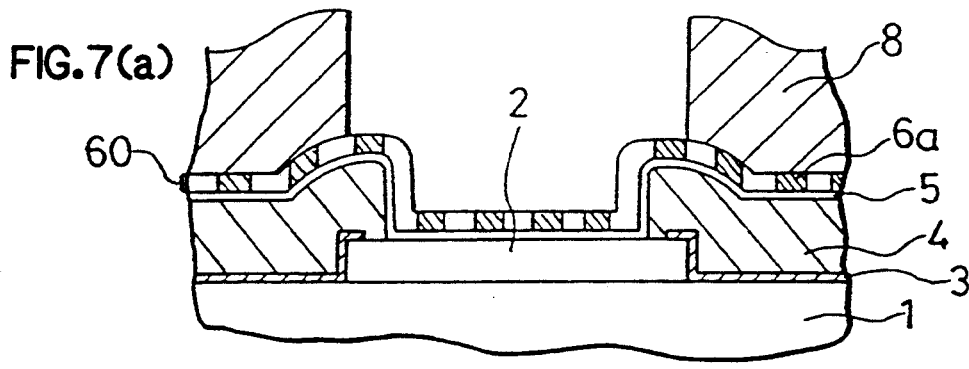
FIGS. 7(a) to 7(c) are sectional views showing process steps of forming an electrolytic Au Plated layer in the sixth embodiment of the present invention.
Figure 7B:
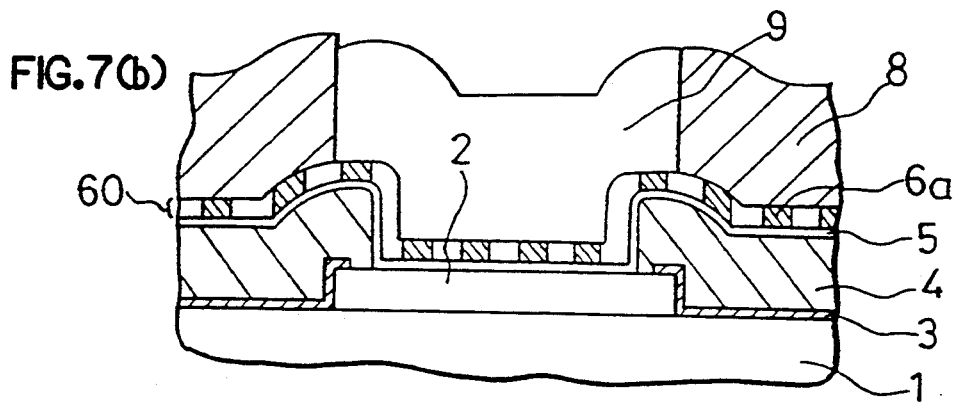
Figure 7C:
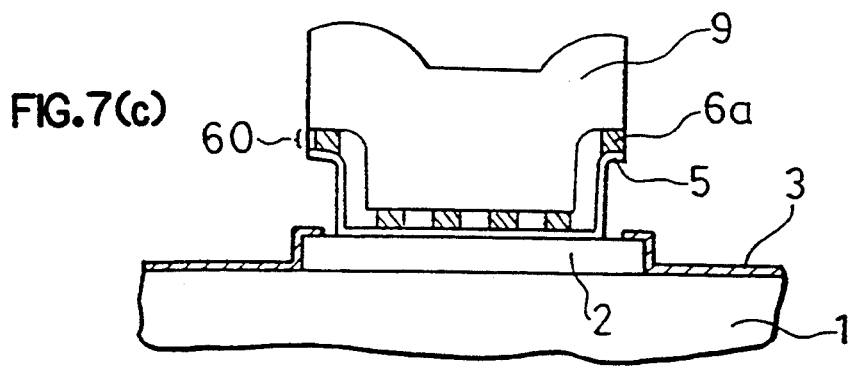
Figure 8:
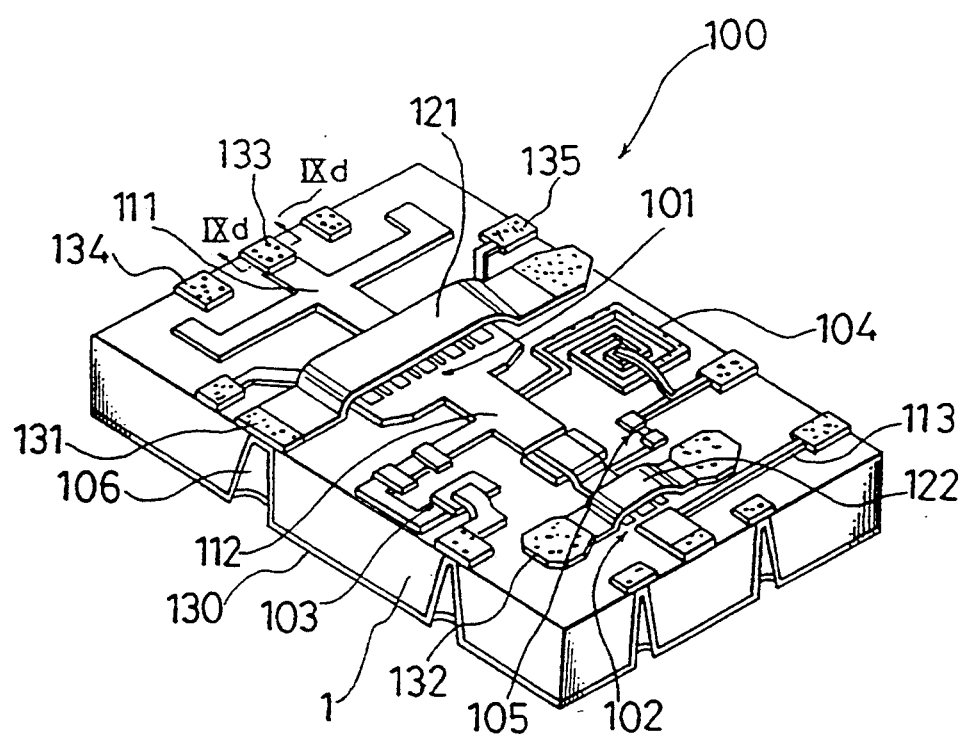
FIG. 8 is a perspective view showing a schematic structure of a conventional MMIC.

FIGS. 6 and 7 are sectional views showing a method for manufacturing a semiconductor device in accordance with a sixth embodiment of the present invention. FIGS. 6(a) to 6(d) show the steps of forming the conductive buffer layer by ion implantation and FIGS. 7(a) to 7(c) show the steps after that. In FIG. 7(c), reference numeral 60 designates a conductive buffer layer formed between the Ti adhesion layer 5 and the electrolytic Au layer 9, whose crystallinity is disordered by partially implanting ions to the feeder Au layer 6. Reference numeral 6a designates an ion implanted part formed in a grid on the feeder Au layer 6. The grain size of the part 6a is uniformly 0.3 or less.

Next, the manufacturing method will be described. Since the steps until the feeder Au layer 6 is formed (FIG. 6(a)) are the same as in the first embodiment of the present invention, their description is omitted. After the step of FIG. 6(a), an additional resist layer 11 is applied to the whole surface and a resist pattern is formed by exposure and development (FIG. 6(b)). In this case, the additional resist layer 11 is patterned so that a grid of rectangular resist elements approximately 1 micron square is arranged on the surface. Then, ions 12 such as Si are implanted in the feeder Au layer 6 using the additional resist layer 11 as a mask to form the ion implanted part 6a, whereby the conductive buffer layer 60 is formed (FIG. 6(c)). Thereafter, the additional resist layer 11 is removed (FIG. 6(d)).

Then, the second resist layer 8 is applied and patterned to form the resist pattern (FIG. 7(a)), and the electrolytic Au layer 9 is formed using the above pattern as a mask (FIG. 7(b)). Then, the second resist layer 8, the conductive buffer layer 60, the adhesion layer 5 and the first resist layer 4 are sequentially removed and then the bonding pad having a section structure shown in FIG. 7(c) is obtained.

In this sixth embodiment of the present invention, since ion implantation is selectively except for the rectangular resist elements approximately 1 micron square on the feeder Au layer 6 serves as the base layer of the electrolytic Au plating layer, the grain size of the electrolytic Au layer 9 is 1 micron or less in its initial stage and growth of the crystal grains is suppressed. Thus, the crystal grain size is not largely increased even after plating of approximately 2 to 3 microns, so that a uniform plating morphology can be obtained.

In addition, although the Au layer is described as a low resistance plated metal layer in the above-described first to sixth embodiments, the low resistance plated metal layer is not so limited and, for example, silver or copper can be used.

As described above, according to the method for manufacturing a semiconductor device of the present invention, the conductive buffer layer which cancels the effects of the crystallinity of a lower layer is formed on the base metal layer, the metal layer is selectively formed on the conductive buffer layer, and the layer whose grain size is controlled so as to be a predetermined value or less is used as the conductive buffer layer. Thus, luster uniformity on the electrolytic layer is significantly improved, whereby the position of the electrode pad is easily mechanically detected and automation using auto-bonding in a packaging process is not affected and appearance is improved. As a result, the value of the device such as an MMIC can be enhanced.

In addition, since the amorphous layer serving as the conductive buffer layer is formed by electroless plating, the conductive buffer layer can be easily formed by only immersion in a plating solution in addition to the above effect.

In addition, since the amorphous alloy layer is formed by sputtering, a catalytic layer for electroless plating is not necessary. In addition, since the metal adhesion layer and the feeder metal layer for are also formed by sputtering, these metal layers can be sequentially formed with good operability.

In addition, since the amorphous layer is formed by electrolytic, the Pd activated layer serving as a catalyst for electroless plating is not necessary and process can be smoothly moved to the step of forming the electrolytic Au layer.

In addition, since the palladium film whose grain size on the surface is uniformly controlled so as to be 0.3 micron or less is the conductive buffer layer, the conductive buffer layer can be easily formed by immersing it into the PdCl$_2$ solution, sputtering or vapor deposition.

In addition, since the conductive buffer layer is formed by implanting ions in the feeder metal layer on the base metal layer using a mask having a grid-shaped opening pattern, the conductive buffer layer can serve as the feeder metal layer for plating, so that process for forming the film can be simplified.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semi-conductor device contact comprising:
    forming a first mask on a base metal layer by depositing a first resist film and patterning said first resist film to expose part of said base metal layer;
    sequentially depositing on said base metal layer a metal adhesion layer strongly adherent to said base metal layer and a feeder metal layer as a cathode for electrolytic plating, and a Pd activated layer;
    forming a second mask by depositing a second resist film on said Pd activated layer and patterning said second resist film to include an opening exposing part of said Pd activated layer;
    forming an amorphous conductive buffer layer in the opening in said second resist film; and
    forming a plated gold layer on said conductive buffer layer in the opening in said second resist film by electrolytic plating.

2. The method of claim 1 including forming said amorphous conductive buffer layer by electroless plating.

3. The method of claim 1 including forming said amorphous conductive buffer layer by sputtering.

4. The method of claim 1 including forming said amorphous conductive buffer layer by electrolytic plating.

5. The method of claim 1 including depositing titanium as said metal adhesion layer.

6. The method of claim 1 including forming Ni-P as said amorphous conductive buffer layer.

7. A method for manufacturing a semiconductor device contact comprising:
    forming a first mask on a base metal layer by depositing a first resist film and patterning said first resist film to expose part of said base metal layer;
    sequentially depositing on said base metal layer a metal adhesion layer strongly adherent to said base metal layer, an amorphous metal layer as a conductive buffer layer, and a feeder metal layer as a cathode for electrolytic plating;
    forming a second mask by applying a second resist film on said feeder metal layer and patterning said second resist film to include an opening exposing part of said feeder metal layer; and
    forming a plated gold layer on said feeder metal layer in the opening in said second resist film by electrolytic plating.

8. The method of claim 7 including depositing titanium as said metal adhesion layer.

9. The method of claim 7 including forming Ni-P as said amorphous meal layer.

10. A method for manufacturing a semiconductor device contact comprising:
    forming a first mask on a base metal layer by depositing a first resist film and patterning said first resist film to expose part of said base metal layer;
    sequentially depositing on said base metal layer a metal adhesion layer strongly adherent to said base metal layer and a feeder metal layer as a cathode for electrolytic plating;

forming a second mask by depositing a second resist film on said feeder metal layer and patterning said second resist film to include an opening exposing part of said feeder metal layer;

forming an amorphous conductive buffer layer in the opening in said second resist film by electroless plating; and forming a plated gold layer on said conductive buffer layer in the opening in said second resist film by electrolytic plating.

11. The method of claim 10 including depositing titanium as said metal adhesion layer.

12. The method of claim 10 including depositing an amorphous conductive buffer layer selected from the group consisting of Ni-P, Co-P, Fe-P, Co-Ni-P, Co-W, Fe-W, Cr-W, Fe-Mo, and Cr-Fe.

13. A method for manufacturing a semiconductor device contact comprising:

forming a first mask on a base metal layer by depositing a first resist film and patterning said first resist film to expose part of said base layer;

sequentially depositing on said base metal layer a metal adhesion layer strongly adherent to said base metal layer and a feeder metal layer as a cathode for electrolytic plating;

forming a second mask by depositing a second resist film on said feeder metal layer and patterning said second resist film to include an opening exposing part of said feeder metal layer;

forming a palladium film as a conductive buffer layer in the opening in said second resist film by immersion in a $PdCl_2$ solution, the palladium film having an exposed surface and a crystalline grain size at the surface no larger than 0.3 micron; and forming a plated metal layer on said palladium film in the opening in said second resist film.

14. The method of claim 13 including depositing titanium as said metal adhesion layer.

15. A method for manufacturing a semiconductor device contact comprising:

forming a first mask on a base metal layer by depositing a first resist film and patterning said first resist film to expose part of said base metal layer;

sequentially depositing on said base metal layer a metal adhesion layer strongly adherent to said base metal layer and a feeder metal layer as a cathode for electrolytic plating;

depositing on said feeder metal layer a second resist film and patterning said second resist film so that a plurality of rectangular parts of said second resist film each about 1 micron square arranged in a pattern are left on said feeder metal layer;

implanting ions in said feeder metal layer using said second resist film as a mask and thereafter removing said second resist film;

forming a second mask by depositing a third resist film on said feeder metal layer and patterning said third resist film to include an opening exposing part of said feeder metal layer; and plating a gold layer on said feeder metal layer in the opening in said third resist film.

16. The method of claim 15 wherein said feeder metal layer is gold including implanting silicon ions in said feeder metal layer.

* * * * *